United States Patent [19]

Sudbo et al.

[11] Patent Number: 5,115,294

[45] Date of Patent: May 19, 1992

[54] OPTOELECTRONIC INTEGRATED CIRCUIT

[75] Inventors: Aasmund S. Sudbo, Summit; Won-Tien Tsang, Holmdel; Long Yang, Edison, all of N.J.

[73] Assignee: AT&T Bell Laboratories, Murray Hill, N.J.

[21] Appl. No.: 746,308

[22] Filed: Aug. 14, 1991

Related U.S. Application Data

[63] Continuation of Ser. No. 527,672, May 21, 1990, abandoned, which is a continuation of Ser. No. 373,968, Jun. 29, 1989, abandoned.

[51] Int. Cl.⁵ .................. H01L 29/48; H01L 27/14; H01L 23/48
[52] U.S. Cl. ........................ 357/30; 357/15; 357/64
[58] Field of Search ............. 357/17, 19, 30 P, 30 PF, 357/30 I, 30 D, 30 B, 30 E, 30 C, 61, 64

[56] References Cited

U.S. PATENT DOCUMENTS

| | | | |
|---|---|---|---|
| 4,203,780 | 5/1980 | Matsushita et al. | 357/64 |
| 4,357,180 | 11/1982 | Molnar | 357/61 |
| 4,390,889 | 6/1983 | Capasso et al. | 357/30 E |
| 4,490,709 | 12/1984 | Hammond et al. | 357/64 |
| 4,679,061 | 7/1987 | Capasso et al. | 357/30 E |
| 4,739,385 | 4/1988 | Bethea et al. | 357/30 E |
| 4,763,176 | 8/1988 | Ito | 357/15 |
| 4,819,036 | 4/1989 | Kuroda et al. | 357/30 E |
| 4,929,564 | 5/1990 | Kainosho et al. | 437/20 |

FOREIGN PATENT DOCUMENTS

| | | | |
|---|---|---|---|
| 0186460 | 12/1985 | European Pat. Off. | 357/30 E |
| 55-082473 | 6/1980 | Japan | 357/30 E |
| 57-104274 | 6/1982 | Japan | 357/30 E |
| 58-138082 | 8/1983 | Japan | 357/30 E |
| 61-056469 | 3/1986 | Japan | 357/30 C |
| 61-154085 | 7/1986 | Japan | 357/30 C |
| 62-159477 | 7/1987 | Japan | 357/30 C |
| 62-291184 | 12/1987 | Japan | 357/30 E |
| 62-293786 | 12/1987 | Japan | 357/30 E |
| 1-089361 | 4/1989 | Japan | 357/30 C |

OTHER PUBLICATIONS

Wolf, *Semiconductors*, pp. 223-228, 1971.
Schneider, "Schottky Barrier Photodiode w/Antireflection Coating", Nov. 1966, pp. 1611-1615.
Chang et al., Monolithically Integrated Receiver Front End: Sep. 1988, pp. 1439-1443 of IEEE.
Hong et al., High-Performance $Al_{0.15}Ga_{0.85}As/In_{0.53}Ga_{0.47}As$: Apr. 1989, pp. 659-661 of IEEE.
Rogers, D. L., "Monolithic Integration of a 3-GHz Detector/Preamplifier Using a Refractory-Gate, Ion-Implanted MESFET Process", *IEEE Electron Device Letts.*, vol. EDL-7, No. 11, Nov. 1986, pp. 600-602.
Schumacher, H. et al., "An Investigation of the Optoelectronic Response of GaAs/InGaAs MSM Photodetectors", *IEEE Electron Device Letts.*, vol. 9, No. 11, Nov. 1988, pp. 607-609.
Wada, O. et al., "Very High Speed GaInAs Metal-Semiconductor-Metal Photodiode Incorporating an AlInAs/GaInAs Graded Superlattice", *Appl. Phys. Lett.*, vol. 54, No. 1, Jan. 2, 1989, pp. 16-17.

*Primary Examiner*—William D. Larkins
*Assistant Examiner*—Donald L. Monin
*Attorney, Agent, or Firm*—Bernard Tiegerman; Glen Books

[57] ABSTRACT

A new MSM photodetector, including a photoabsorbing layer of ternary or quaternary III-V compound semiconductor material, is disclosed. This new photodetector is significant because it exhibits a relatively small dark current and a correspondingly large signal-to-noise ratio. Moreover, the photodetector is readily integrable with electronic integrated circuits and is relatively easy to fabricate.

4 Claims, 1 Drawing Sheet

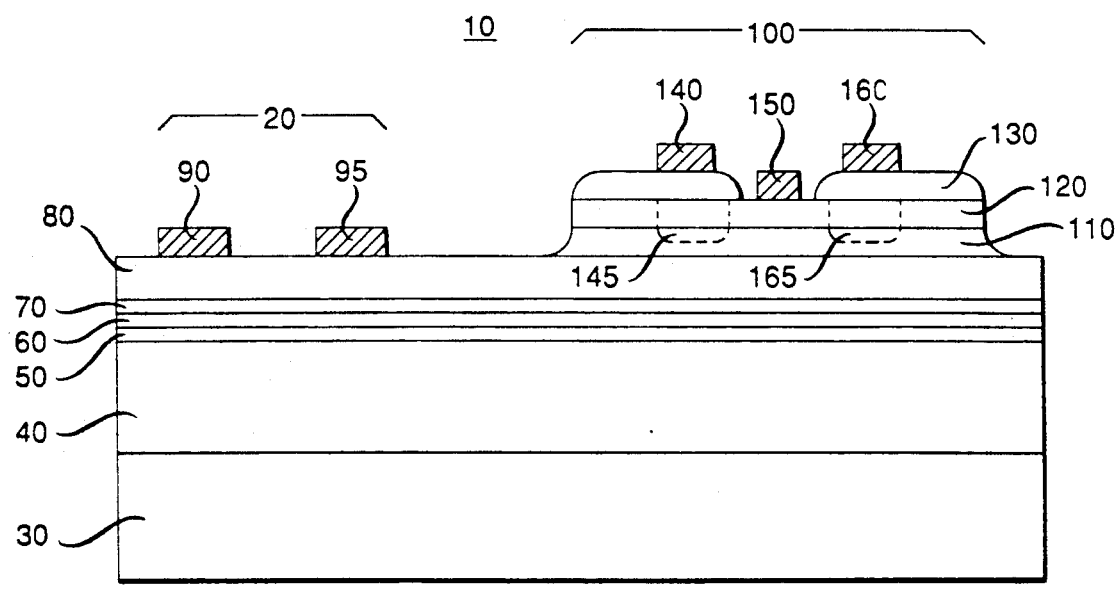

OPTOELECTRONIC INTEGRATED CIRCUIT

This application is a continuation of application Ser. No. 07/527.672, filed on May 21, 1990, now abandoned, which is a continuation of application Ser. No. 07/373,968 filed on Jun. 29, 1989, now abandoned.

BACKGROUND OF THE INVENTION

1. Field of the Invention

The invention pertains generally to optoelectronic integrated circuits, i.e., circuits in which optical devices, such as photodetectors, are integrated with one or more electronic devices, such as transistors.

2. Art Background

Optical communication systems, e.g., optical fiber communication systems, include photodetectors which serve to convert optical signals into electrical signals, which are processed using electronic integrated circuits (ICs). The photodetectors employed in such systems have conventionally been discrete devices, formed in substrates different from those employed in forming the electronic ICs, with the discrete photodetector devices being electrically connected to the electronic ICs via electrical wires. In this regard, to reduce costs and enhance performance, there has been a desire to integrate the photodetectors with the electronic ICs, i.e., to form both on the same substrate, and thus form monolithic, optoelectronic ICs.

In optical communication systems operating at wavelengths of 0.8 micrometers ($\mu$m), the photodetectors have typically been fabricated in substrates of GaAs, a III-V compound semiconductor material which absorbs light of this wavelength. Significantly, a GaAs photodetector has been fabricated in a metal-semiconductor-metal (MSM) device configuration, which permitted ready integration with metal-semiconductor field effect transistors (MESFETs). (See D. L. Rogers, "Monolithic Integration of a 3-GHz Detector/Preamplifier Using a Refractory-Gate, Ion-Implanted MESFET Process". *IEEE Electron Device Letters*, Vol. EDL-7, No. 11, November 1986, pp. 600-602.) That is, the metal electrodes of the photodetector (used to collect the electrical charge carriers produced by the absorption of light) were formed on the same surface of a layer of GaAs, with the metal electrodes being spaced apart from one another to permit absorption of light by an intervening region of GaAs. In addition, MESFETs were formed on the same layer surface, adjacent, and electrically connected, to the MSM photodetector.

Among other characteristics, the MSM photodetector of the optoelectronic IC, described above, exhibited a relatively high signal-to-noise (S/N) ratio. That is, the metal electrodes formed Schottky contacts (rectifying metal-semiconductor contacts) to the GaAs, and the corresponding potential barriers to the emission of electrons and holes from the metal electrodes into the GaAs were relatively high. As a consequence, the dark current the current which flows through the photodetector in the absence of light) was relatively small, resulting in a relatively high S/N ratio.

To reduce the effects of dispersion and/or optical loss, long distance optical fiber communication systems employing silica optical fibers are now being operated at wavelengths of 1.3 $\mu$m and/or 1.55 $\mu$m. Significantly, the corresponding photodetectors are fabricated in ternary and quaternary III-V compound semiconductors, i.e., ternary alloys in the In-Ga-As system and quaternary alloys in the In-Ga-As-P system. Unfortunately, when metal electrodes are formed on these ternary and quaternary semiconductors, the resulting Schottky contacts exhibit relatively small potential barriers to electrons in the metal electrodes. As a result, the corresponding dark currents in these MSM photodetectors are relatively high and the S/N ratios are relatively low.

Attempts have been made to reduce dark currents in MSM photodetectors formed in the ternary and quaternary semiconductors. In one such attempt, a layer of GaAs was formed on a photoabsorbing layer of $In_{0.53}Ga_{0.47}As$, and the metal electrodes were formed on the GaAs. (See H. Schumacher et al. "An Investigation of the Optoelectronic Response of GaAs/InGaAs MSM Photodetectors." *IEEE Electron Device Letters*, Vol. 9, No. 11, November 1988, pp. 607-609). While this procedure reduced dark currents, the procedure is considered less desirable because the substantial lattice mismatch between GaAs and $In_{0.53}Ga_{0.47}As$ introduces undesirable strain and misfit dislocations into the former.

In another attempt to reduce dark currents, a layer of $In_{0.52}Al_{0.48}As$ was formed over a photoabsorbing layer of $In_{0.53}Ga_{0.47}As$, the former serving to enhance the potential barrier to electrons at the metal-semiconductor interface. To reduce carrier trapping caused by the relatively large band discontinuity at the $In_{0.52}Al_{0.48}As$/$In_{0.53}Ga_{0.47}As$ interface, a graded superlattice, consisting of ultrathin layers of InAlAs and InGaAs, was incorporated between the $In_{0.52}Al_{0.48}As$ and $In_{0.53}Ga_{0.47}As$ layers. (See O. Wada et al, "Very high speed GaInAs metal-semiconductor-metal photodiode incorporating an AlInAs/GaInAs graded superlattice." *Appl. Phys. Lett.*, Vol. 54, No. 1,2 January 1989, pp. 16-17.) While it has been asserted that this photodetector exhibits a relatively low dark current, its manufacture is relatively complicated. That is, the formation of the $In_{0.52}Al_{0.48}As$, a ternary, is inherently more difficult and more complicated that that of, for example, a binary. In addition, the fabrication of the graded superlattice necessarily requires the use of a relatively sophisticated technique, such as molecular beam epitaxy (MBE).

Thus, those engaged in developing optoelectronic ICs have sought, and continue to seek, photodetectors having configurations which result in relatively low dark currents, permit ready integration with electronic ICs, and are relatively easy to fabricate.

SUMMARY OF THE INVENTION

The invention involves a MSM photodetector including a photoabsorbing layer of ternary or quaternary III-V compound semiconductor material, which exhibits a relatively small dark current and a correspondingly large S/N ratio, is readily integrable with electronic ICs and is relatively easy to fabricate. That is, the inventive MSM photodetector includes a layer of InP overlying the photoabsorbing layer, the latter having a composition, represented by the formula $In_{1-x}Ga_xAs_yP_{1-y}$, which is preferably chosen to ensure that the photoabsorbing layer is substantially lattice matched to the InP and thus substantially free of strain and misfit dislocations. Significantly, the InP is doped with Fe, Ti, Co or Ta, which serve to increase the effective Schottky barrier height to electrons without detrimentally decreasing the Schottky barrier height to holes. As a result, dark currents are substantially reduced and the corresponding S/N ratios increased. In addition, the (doped) InP is a binary semiconductor which is relatively easy to form and, moreover, is semi-insulating. Consequently, if, for example, the material layers of one or more transistors are deposited onto the doped InP, then this doped layer also serves to electrically insulate the transistors from the photodetector, increasing the ease with which the transistors are integrated with the photodetector.

BRIEF DESCRIPTION OF THE DRAWING(S)

The invention is described with reference to the sole accompanying drawing, which is a cross-sectional view of one embodiment of the inventive optoelectronic IC.

DETAILED DESCRIPTION

The invention involves an optoelectronic IC in which a MSM photodetector is integrated with one or more electronic devices, such as transistors.

With reference to the sole accompanying figure, the inventive optoelectronic IC 10 comprises a MSM photodetector 20 which includes a semi-insulating substrate 30 of, for example, Fe-doped InP. The photodetector 20 also includes a photoabsorbing layer 40 of ternary or quaternary III-V compound semiconductor material. In addition, the photodetector includes a layer 80 of InP which, in one embodiment of the invention, is formed directly on the upper surface of the photoabsorbing layer 40. The photodetector also includes at least two spaced metal electrodes 90 and 95 (as depicted in the figure) formed on the upper surface of the layer 80, and preferably includes an interdigitated pattern of metal electrodes, i.e., a pattern of finger-like, interleaving electrodes, with adjacent electrode fingers being separated by intervening regions of the upper surface of the layer 80. In use, when subjected to an applied voltage, the electrodes serve to collect the charge carriers in the photoabsorbing layer produced by the absorption of light.

Significantly, the composition of the photoabsorbing layer 40 encompasses ternary and quaternary alloys in the In-Ga-As and In-Ga-As-P systems, and is generically given by $In_{1-x}Ga_xAs_yP_{1-y}$, where $0 < y \leq 1$. In addition, x is preferably chosen so that $$x = \frac{0.4526y}{1 - 0.031y} (1 \pm 0.1),$$

which ensures that the photoabsorbing layer is substantially lattice-matched to the layer 80 of InP (as well as to the Fe-doped InP substrate 30) and thus substantially free of undesirable strain. In this regard, the presence of strain in the photoabsorbing layer 40 results in the presence of misfit dislocations. Such dislocations are undesirable because they reduce the quantum efficiency and increase the dark current of the photodetector.

The thickness of the photoabsorbing layer 40 ranges from about 0.5 μm to about 2 μm. Thickness less than about 0.5 μm are undesirable because the corresponding layers absorb an undesirably small fraction of the incident light. Thicknesses greater than about 2 μm, while not precluded, are less desirable because they require a relatively long time to grow and layers having a thickness of, for example, 2 μm, are capable of absorbing essentially all of the incident light.

Equally significantly, the layer 80 of InP is doped with one or more dopants which, it has been found, substantially reduce the dark currents which are otherwise present in the photoabsorbing layer 40 if the InP is undoped, or if the metal electrodes are formed directly on the upper surface of the photoabsorbing layer 40.

The dopants found to be useful in this regard include Fe, Ti, Co and Ta.

It has also been found that the concentration of the dopant or dopants in, and the thickness of, the layer 80 needed to reduce the dark currents are interrelated. That is, the higher the dopant concentration, the smaller the needed thickness, and vice versa. In general, the utility of a particular dopant concentration and thickness is determined empirically by measuring the corresponding dark current. By way of example, if the layer 80 is doped with Fe, then it has been found that a dopant concentration of $10^{19}$ per cubic centimeter ($cm^{-3}$) and a thickness of 100 nanometers (nm) are useful in substantially reducing dark currents.

Although the utility of the invention is not dependent upon the validity of any theory, a theory has been formulated which, it is believed, serves to explain the effect of the dopants. That is, in the absence of the dopants, the Fermi level of the electrons in the metal electrodes is close to the lower edge of the conduction band in the InP. As a consequence, the electrons in the metal see only a small potential barrier at the metal/semiconductor interface, resulting in a relatively large dark current. (It should be noted that the potential barrier seen by the holes in the metal electrodes is correspondingly large. In this regard, as is known, the sum of the electron and hole Schottky barrier heights is equal to the bandgap of InP.) Significantly, the dopants, listed above, constitute acceptors in InP which, it is believed, introduce an energy level approximately in the middle of the bandgap. When this midgap energy level is filled by electrons from the metal, a space-charge layer is produced which creates a potential barrier to electrons in the metal, i.e., the effective Schottky barrier height to electrons is increased. (The thickness of the layer 80 must necessarily be equal to or greater than the thickness of this space charge layer to permit the increase in effective Schottky barrier height to be achieved.) Although the effective Schottky barrier height to holes is necessarily decreased, this barrier is still sufficiently high to largely preclude the emission of holes from the metal into the photoabsorbing layer 40. In this regard, it is believed that the optimum position of the energy level introduced by the acceptors, for reducing the total emission of both electrons and holes from the metal into the semiconductor, is precisely in the middle of the bandgap.

If one assumes a worst-case scenario for the initial position of the Fermi level of the electrons in the metal electrodes, i.e., the Fermi level is aligned with the lower edge of the conduction band in the InP, if one assumes the dopant introduces an energy level precisely in the middle of the bandgap, and if one requires the thickness of the layer 80 to be greater than that of the space charge layer, then the above theory implies that the dopant concentration, C, and the thickness of the layer 80, t, are related by the following formula:

$$\frac{e \cdot C \cdot t^2}{2\epsilon} > \frac{1}{2}(E_c - E_v). \qquad (1)$$

Here, e denotes electron charge, $\epsilon$ denotes the dielectric constant of InP and $(E_c - E_v)$ denotes the bandgap of InP.

While not essential to the invention, the MSM photodetector 10 preferably includes one or more layers, sandwiched between the photoabsorbing layer 40 and the doped layer 80, which serve to reduce the bandgap discontinuity which otherwise exists at the interface between the layers 40 and 80. If but a single such layer is used, then the composition of this layer should vary along the thickness direction so that the bandgap at the bottom of the layer is the same as, or close to, that of the photoabsorbing layer 40, while the bandgap at the top of this layer should be the same as, or close to, that of the layer 80 of InP.

While the fabrication of a single layer having an essentially continuous variation in composition is certainly possible, it is generally more convenient to use a plurality of compositionally distinct layers, e.g., three compositionally distinct layers 50, 60 and 70 (as depicted in the figure), to reduce the bandgap discontinuity. In this regard, if, for example, the composition of the photoabsorbing layer 40 is such that $y=1$ and $x=0.47$, and if the compositions of each of the layers 50, 60, and 70 is, again, given by the formula $In_{1-x}Ga_xAs_yP_{1-y}$, then useful values of x and y (and thus useful compositions) for the layers 50, 60 and 70 are, respectively: $y=0.9$, $x=0.41$ (layer 50); $y=0.62$, $x=0.28$ (layer 60); and $y=0.32$, $x=0.15$ (layer 70). In addition, to have a significant effect on the bandgap discontinuity, the thickness of each of the layers 50, 60 and 70 should be greater than or equal to about 0.02 μm. On the other hand, the combined thicknesses of the layers 50, 60, 70 and 80 should be less than half the thickness of the photoabsorbing layer 40, to ensure efficient collection of photogenerated carriers.

It should be noted that all the various layers of the MSM photodetector 20 are readily fabricated using conventional techniques such as metal-organic chemical vapor deposition (MOCVD) techniques, and thus the inventive photodetector is relatively easy to fabricate.

The electrodes 90 and 95 of the photodetector 20 are conventional and include, for example, successive layers of Ti and Au having corresponding thicknesses of, for example, 50 nm and 100 nm, and widths of, for example, 1 μm. The spacing between the electrodes should be greater than the thickness of the photoabsorbing layer 40, so that the application of a voltage to the electrodes results in an electric field distribution within the layer 40 which permits fast and efficient collection of photogenerated carriers. It should be noted that the speed of response of the photodetector will decrease as electrode spacing is increased.

Significantly, by virtue of the presence of the dopants, the doped layer 80 of InP is semi-insulating, i.e., exhibits a resistivity of at least 1 megohm-centimeter (MΩ-cm). As a consequence, the material layers associated with one or more electronic devices, e.g., transistors, are readily deposited onto the layer 80 and devices formed in these material layers, with the semi-insulating layer 80 serving to electrically insulate the electronic devices from the MSM photodetector 20. In this regard, the dopant concentration, C, and the thickness of the layer 80, t, are chosen not only to reduce dark currents, but also to achieve a desired degree of electrical insulation between the electronic devices and the photodetector. Thus, for example, if the dopant is Fe, then a dopant concentration of $10^{19}$ cm$^{-3}$ and a layer thickness of 100 nm not only serve to reduce dark currents, but also result in the layer 80 providing a satisfactory degree of electrical insulation.

By way of example, one or more conventional In-Ga-As MESFETs 100 (see the figure) are readily integrated with the photodetector 20 by initially depositing a layer 110 of, for example, n-type $In_{0.53}Ga_{0.47}As$, having a thickness of, for example, 100 nm, onto the semi-insulating layer 80. Then, a semi-insulating layer 120 of Fe-doped InP, having a thickness of, for example, 30 nm, is deposited onto the layer 120. Thereafter, a layer 130 of $n^+$-type $In_{0.53}Ga_{0.47}As$, having a thickness of, for example, 50 nm, is deposited onto the layer 120. After deposition, the layers 110, 120 and 130 are etched down to the layer 80 to form a mesa for each MESFET, as is conventional.

After the formation of the mesas, the layer 130 is patterned to expose generally rectangular surface areas of the underlying layer 120. Gate electrodes 150 are formed on these exposed areas, along with adjacent source and drain electrodes 140 and 160, using conventional techniques. The gate electrodes 150 include, for example, successive layers of Ti and Au. The source and drain electrodes 140 and 160 include, for example, successive layers of Ni, Ge, Au, Ag and Au. After depositing the layers constituting the source and drain electrodes, the substrate is heated to diffuse the Ge into and through the layers 130 and 120 into the layer 110, to thereby form source and drain regions 145 and 165 and to achieve ohmic contacts at the source/drain electrode-semiconductor interfaces.

It should be noted that all the layers depicted in the figure are readily successively epitaxially grown, in the same reactor, with little or no time delay between the growth of succeeding layers.

We claim:

1. A device comprising:
    a photodetector for 1.3–1.55 micron radiation including a first layer of semiconductor material and first and second spaced metal electrodes overlying said first layer, characterized in that
    said first layer has a composition which includes $In_{1-x}Ga_xAs_yP_{1-y}$, where $0 < y \leq 1$ and $$x = \frac{0.4526y}{1 - 0.031y} (1 \pm 0.1), \text{ and}$$

said photodetector also includes a second layer of semiconductor material having a composition which includes InP doped with an acceptor dopant chosen from the group consisting of Fe, Ti, Co and Ta, said second layer being positioned between said electrodes and said first layer, said electrodes contacting a surface of said second layer but not the first layer so that a region of doped InP separates the metal electrodes from the first layer and so that a Schottky barrier is formed between the said electrodes and the surface of the second layer.

2. The device of claim 1, further comprising a transistor overlying said second layer, said transistor being in electrical communication with said photodetector.

3. The device of claim 2, wherein said transistor is a field effect transistor.

4. A metal-semiconductor-metal photodetector comprising:
    a substrate of material having a resistivity in excess of 1 megohm-cm;
    a photoabsorbing layer of III-V compound semiconductor material disposed on said substrate;
    a region of indium phosphide formed on the upper surface of the photoabsorbing layer, said indium phosphide doped to a resistivity of at least 1 megohm-cm by acceptor dopants which introduce an energy level in the middle of the indium phosphide bandgap;
    and a pair of electrodes disposed in spaced apart relationship on said region of indium phosphide.

* * * * *